United States Patent
Chen

(10) Patent No.: US 10,924,094 B1
(45) Date of Patent: Feb. 16, 2021

(54) PULSE WIDTH MODULATION CONTROL CIRCUIT AND CONTROL METHOD OF PULSE WIDTH MODULATION SIGNAL

(71) Applicant: Power Forest Technology Corporation, Hsinchu County (TW)

(72) Inventor: Yueh-Chang Chen, Hsinchu (TW)

(73) Assignee: Power Forest Technology Corporation, Hsinchu County (TW)

( * ) Notice: Subject to any disclaimer, the term of this patent is extended or adjusted under 35 U.S.C. 154(b) by 0 days.

(21) Appl. No.: 16/558,333

(22) Filed: Sep. 3, 2019

(30) Foreign Application Priority Data

Jul. 31, 2019 (TW) .................................. 108127300

(51) Int. Cl.
| H03K 3/017 | (2006.01) |
| H03K 5/04 | (2006.01) |
| H03K 7/08 | (2006.01) |
| H03K 5/05 | (2006.01) |
| H03K 5/22 | (2006.01) |
| H03L 7/22 | (2006.01) |
| H03K 19/20 | (2006.01) |

(52) U.S. Cl.
CPC ............... *H03K 5/05* (2013.01); *H03K 5/22* (2013.01); *H03K 7/08* (2013.01); *H03K 19/20* (2013.01); *H03L 7/22* (2013.01)

(58) Field of Classification Search
CPC ........ H03K 5/1565; H03K 7/08; H03K 3/017; H03K 7/0812; H03K 5/151; H03K 3/284; H03K 5/13
USPC .................................................. 327/172, 175
See application file for complete search history.

(56) References Cited

U.S. PATENT DOCUMENTS

| 5,920,214 | A | * | 7/1999 | Lee ........................ H04L 7/033 327/147 |
| 8,786,540 | B2 | | 7/2014 | Pauritsch |
| 9,390,659 | B2 | | 7/2016 | Pauritsch |
| 9,568,889 | B1 | * | 2/2017 | Lee ........................ G04F 10/005 |
| 2002/0089439 | A1 | * | 7/2002 | Pasolini ................... H03L 7/06 341/143 |
| 2008/0024230 | A1 | * | 1/2008 | Pera ........................ H03L 7/095 331/16 |
| 2009/0184742 | A1 | | 7/2009 | Kris |
| 2011/0204810 | A1 | * | 8/2011 | Yang ........................ H03K 7/08 315/250 |
| 2013/0082747 | A1 | | 4/2013 | Kris |

FOREIGN PATENT DOCUMENTS

| TW | I418249 | 12/2013 |
| TW | I435546 | 4/2014 |
| TW | I556583 | 11/2016 |

OTHER PUBLICATIONS

"Office Action of Taiwan Counterpart Application," dated Nov. 29, 2019, p. 1-p. 5.

* cited by examiner

*Primary Examiner* — Quan Tra
(74) *Attorney, Agent, or Firm* — JCIPRNET

(57) ABSTRACT

A pulse width modulation control circuit and a control method of a pulse width modulation signal are provided. A counter circuit generates a count value according to a phase-locked loop clock, and resets the count value according to a transition point of a synchronization signal. A comparison circuit compares the count value with a duty ratio set value, and sets the pulse width modulation signal to a high level while the count value is less than the duty ratio set value.

8 Claims, 5 Drawing Sheets

US 10,924,094 B1

PULSE WIDTH MODULATION CONTROL CIRCUIT AND CONTROL METHOD OF PULSE WIDTH MODULATION SIGNAL

CROSS-REFERENCE TO RELATED APPLICATION

This application claims the priority benefit of Taiwan application serial no. 108127300, filed on Jul. 31, 2019. The entirety of the above-mentioned patent application is hereby incorporated by reference herein and made a part of this specification.

BACKGROUND OF THE INVENTION

1. Field of the Invention

The present invention relates to a signal generating device and in particular relates to a pulse width modulation control circuit and a control method of a pulse width modulation signal.

2. Description of Related Art

With response to multi-functionalization of an electronic product at present, generally, different operational power supplies are generated and provided by a power converter. A power conversion device is generally used for realizing conversion among power supplies by switching a power transistor switch by virtue of a pulse width modulation (PWM) signal.

The PWM signal is generally generated by virtue of a PWM signal control device. While an integrated circuit can be miniaturized if the circuit design of the PWM signal control device can be further improved to be simpler under the condition that the PWM signal control device is subjected to integrated circuit (IC) integration, so that the circuit area of the electronic product can be greatly reduced.

SUMMARY OF THE INVENTION

The present invention provides a pulse width modulation control circuit and a control method of a pulse width modulation signal so that the circuit area used by the pulse width modulation control circuit can be effectively reduced.

The pulse width modulation control circuit provided by the present invention comprises a phase-locked loop clock generating circuit, a counter circuit and a comparison circuit. The phase-locked loop clock generating circuit generates a phase-locked loop clock according to a synchronization signal. The counter circuit is coupled to the phase-locked loop clock generating circuit and generates a count value according to the phase-locked loop clock. The count value is reset according to a transition point of the synchronization signal. The comparison circuit is coupled to the counter circuit and is used for generating a pulse width modulation signal. The comparison circuit compares the count value with a duty ratio set value and sets the pulse width modulation signal to a high level while the count value is less than the duty ratio set value.

In one embodiment of the present invention, the pulse width modulation control circuit further comprises an edge detector, coupled to the phase-locked loop clock generating circuit and the counter circuit and detecting a rising edge of the synchronization signal to generate a reset signal, and the counter circuit resets the count value according to the reset signal.

In one embodiment of the present invention, the edge detector comprises a D flip flop, a phase inverter and an AND gate. The data input end of the D flip flop receives the synchronization signal, and the clock input end of the D flip flop receives the phase-locked loop clock. The input end of the phase inverter is coupled to the data output end of the D flip flop. The first input end of the AND gate receives the synchronization signal, the second input end of the AND gate is coupled to the output end of the phase inverter, and the output end of the AND gate outputs the reset signal.

In one embodiment of the present invention, the counter circuit periodically resets the count value at the transition point of the synchronization signal.

In one embodiment of the present invention, the synchronization signal is a vertical synchronization signal.

In one embodiment of the present invention, the count value is reset according to the rising edge of the synchronization signal.

The present invention further provides a control method of a pulse width modulation signal, comprising the following steps: generating a phase-locked loop clock according to a synchronization signal; generating a count value according to the phase-locked loop clock, where the count value is reset according to a transition point of the synchronization signal; comparing the count value with a duty ratio set value; judging whether the count value is less than the duty ratio set value or not; if the count value is less than the duty ratio set value, setting the pulse width modulation signal to a high level; and if the count value is not less than the duty ratio set value, setting the pulse width modulation signal to a low level.

In one embodiment of the present invention, the control method of the pulse width modulation signal comprises: detecting a rising edge of the synchronization signal to generate a reset signal; and resetting the count value according to the reset signal.

In one embodiment of the present invention, the control method of the pulse width modulation signal comprises: periodically resetting the count value at the transition point of the synchronization signal.

In one embodiment of the present invention, the synchronization signal is a vertical synchronization signal.

In one embodiment of the present invention, the count value is reset according to the rising edge of the synchronization signal.

Based on the above, the counter circuit according to the embodiment of the present invention is capable of generating the count value according to the phase-locked loop clock and resetting the count value according to the transition point of the synchronization signal, so that circuits for resetting the count value can be saved, and furthermore, the circuit area used by the pulse width modulation control circuit can be effectively reduced.

In order to make the aforementioned and other objectives and advantages of the present invention comprehensible, embodiments accompanied with figures are described in detail below.

DESCRIPTION OF THE EMBODIMENTS

Figure 1:
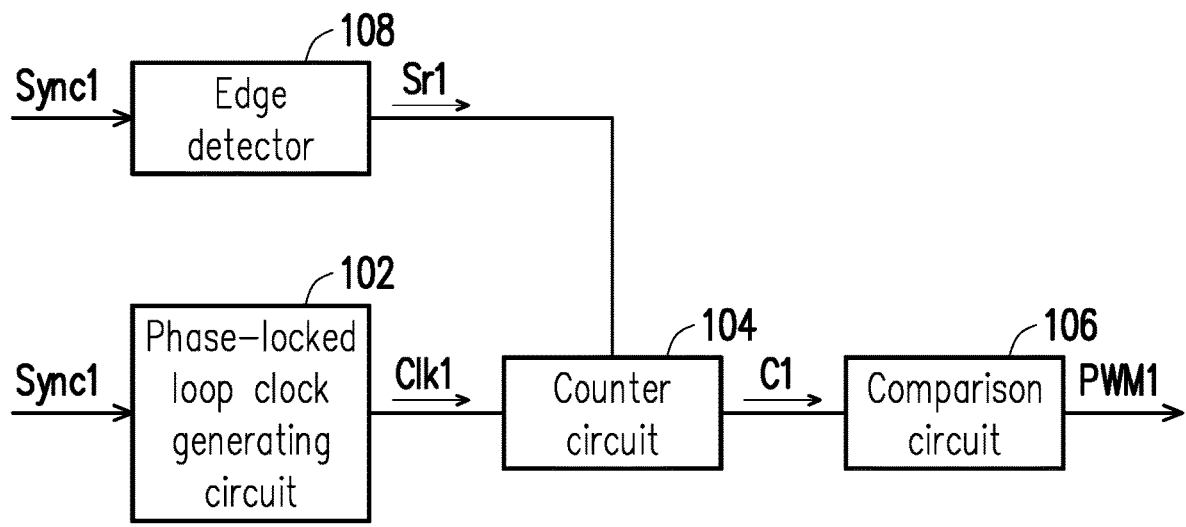
FIG. 1 is a schematic diagram of a pulse width modulation control circuit according to an embodiment of the present invention.

FIG. 1 is a schematic diagram of a pulse width modulation control circuit according to an embodiment of the present invention, refer to FIG. 1. The pulse width modulation control circuit comprises a phase-locked loop clock generating circuit 102, a counter circuit 104, a comparison circuit 106 and an edge detector 108. The counter circuit 104 is coupled to the phase-locked loop clock generating circuit 102, the comparison circuit 106 and the edge detector 108. The phase-locked loop clock generating circuit 102 is capable of receiving a synchronization signal Sync1 and generating a phase-locked loop clock Clk1 according to the synchronization signal Sync1, where the synchronization signal Sync1 may be, for example, a vertical synchronization signal, however, it is not limited thereto. The counter circuit 104 is capable of counting according to the phase-locked loop clock to generate a count value C1. The edge detector 108 is capable of detecting a transition point (for example, a rising edge, however, it is not limited thereto, and a falling edge may also be detected in parts of embodiments) of the synchronization signal Sync1 to generate a reset signal Sr1 to the counter circuit 104, so that the counter circuit 104 resets the count value C1 according to the reset signal Sr1.

The comparison circuit 106 is used for generating a pulse width modulation signal PWM1 according to the count value C1 and a duty ratio set value. The pulse width modulation signal output by the comparison circuit 106 when the count value C1 is less than the duty ratio set value is at a high level, while the pulse width modulation signal PWM1 output by the comparison circuit 106 when the count value C1 is not less than the duty ratio set value is at a low level. The comparison circuit 106 can be made to output the pulse width modulation signal PWM1 converted between the high level and the low level under the coordination of resetting the count value C1 by utilizing the reset signal Sr1 generated by the edge detector 108. The duty ratio of the pulse width modulation signal PWM1 is decided by the duty ratio set value.

The pulse width modulation signal PWM1 may be, for example, transmitted to a driving circuit for driving a backlight module of a display, since the synchronization signal Sync1 may be the vertical synchronization signal, the backlight module can be made to provide a backlight source in a display period of each frame by resetting the count value C1 according to the synchronization signal Sync1 and cooperating with the appropriate duty ratio set value, so that a screen is displayed.

Therefore, if the count value C1 is reset by virtue of the reset signal Sr1 generated according to the transition point of the synchronization signal Sync1 detected by the edge detector 108, a register circuit for storing periodic data of the pulse width modulation signal and a comparator circuit for comparing the periodic data with the count value in a known technology can be omitted, and the circuit area used by the pulse width modulation control circuit can be effectively reduced.

Figure 2:
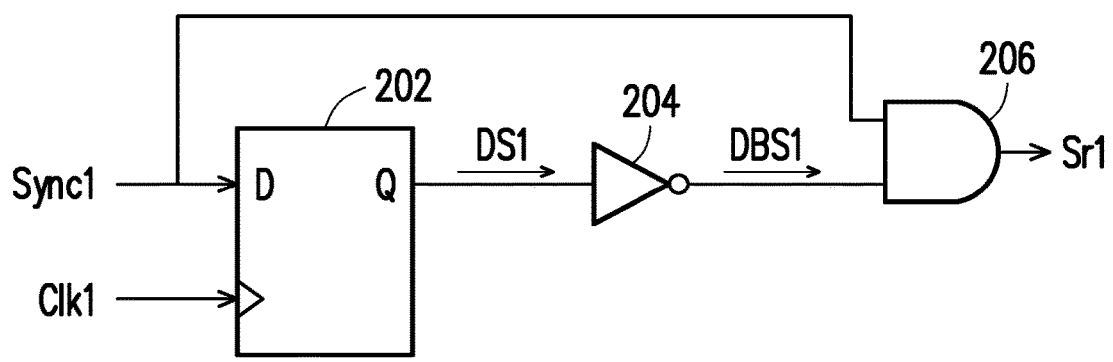
FIG. 2 is a schematic diagram of an edge detector according to an embodiment of the present invention.
Figure 3:
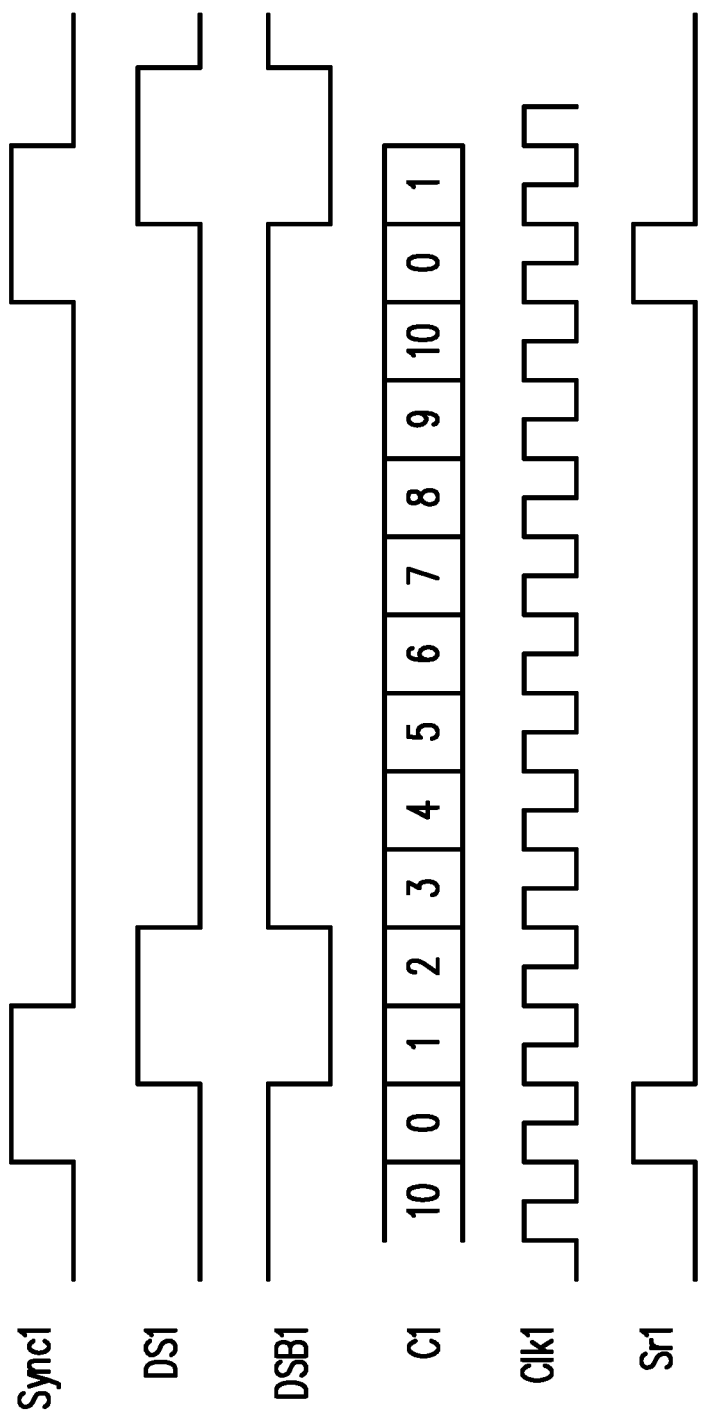
FIG. 3 is a schematic diagram of waveforms of a synchronization signal, a delayed signal, a phase-inverted signal, a count value, a phase-locked loop clock and a reset signal according to an embodiment of the present invention.

Furthermore, the implementation of the edge detector 108 can be as shown in FIG. 2, the edge detector 108 can, for example, comprise a D flip flop 202, a phase inverter 204 and an AND gate 206. The data input end D of the D flip flop 202 receives the synchronization signal Sync1, the clock input end of the D flip flop 202 receives the phase-locked loop clock Clk1, the data output end Q of the D flip flop 202 is coupled to the input end of the phase inverter 204, in addition, one input end of the AND gate 206 receives the synchronization signal Sync1, and the other input end of the AND gate 206 is coupled to the output end of the phase inverter 204. The D flip flop 202 is capable of sampling the synchronization signal Sync1 according to the phase-locked loop clock Clk1 to output a delayed signal DS1, as shown in FIG. 3, the delayed signal DS1 delays the phase-locked loop clock Clk1 for one periodic time relative to the synchronization signal Sync1. The phase inverter 204 performs phase inversion processing on the delayed signal DS1 to output a phase-inverted signal DSB1, and the AND gate 206 performs AND operation on the synchronization signal Sync1 and the phase-inverted signal DSB1 to output a reset signal Sr1. As shown in FIG. 3, the reset signal Sr1 is capable of realizing transition when the transition point (the rising edge of the synchronization signal Sync1 in the embodiment) of the synchronization signal Sync1 appears so as to trigger the counter circuit 104 to reset the count value. In the present embodiment, the count value may be reset to 0 by the reset signal Sr1 when the counter circuit 104 counts from 0 to 10.

Figure 4:
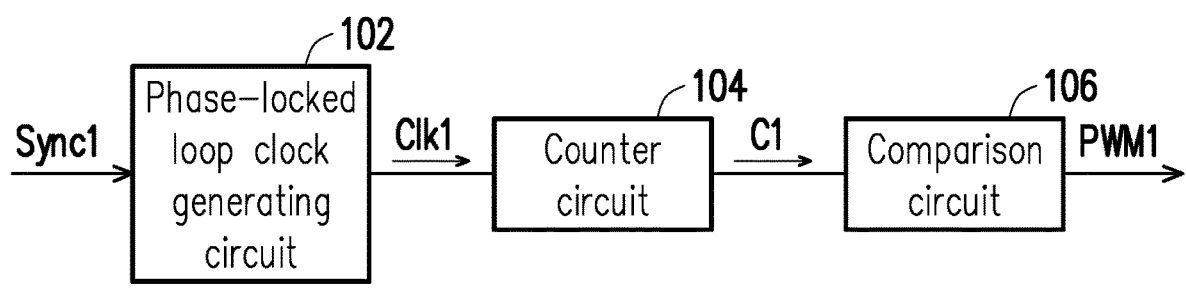
FIG. 4 is a schematic diagram of a pulse width modulation control circuit according to another embodiment of the present invention.
Figure 5:
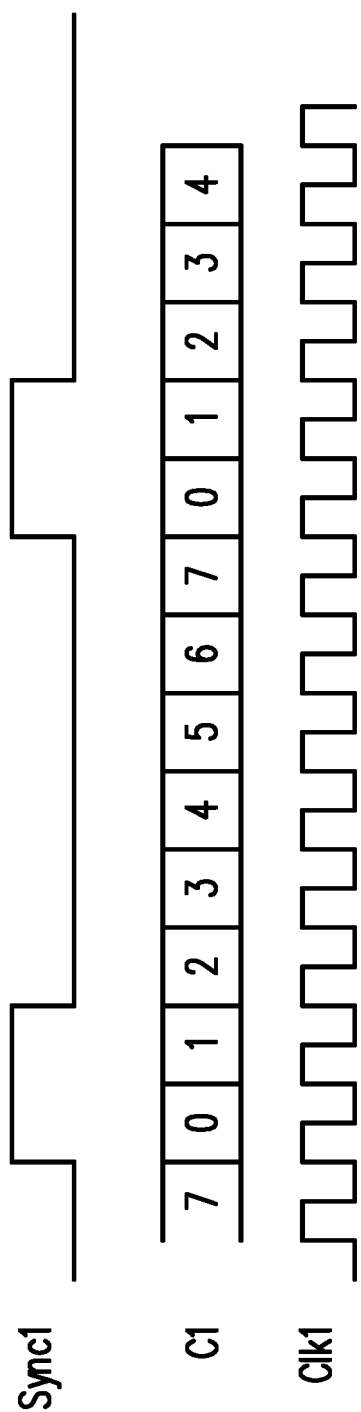
FIG. 5 is a schematic diagram of waveforms of a synchronization signal, a count value and a phase-locked loop clock according to an embodiment of the present invention.

FIG. 4 is a schematic diagram of a pulse width modulation control circuit according to another embodiment of the present invention. In the present embodiment, the counter circuit 104 generates the count value according to the phase-locked loop clock Clk1 and periodically automatically resets the count value. As shown in FIG. 4, the reset period of the counter circuit 104 may be set to be same as the period of the synchronization signal Sync1, for example, the count value can be reset when the rising edge of the synchronization signal Sync1 appears. As shown in FIG. 5, in the present embodiment, the time when the counter circuit 104 counts from 0 to 7 is a time point that the rising edge of the synchronization signal Sync1 appears. In this case, the counter circuit 104 can automatically return to 0 to re-accumulate the count value, and thus, the circuit area used by the pulse width modulation control circuit can be further reduced without resetting the counter circuit 104 by virtue of the edge detector 108. In addition, the implementation details of the phase-locked loop clock generating circuit 102 and the comparison circuit 106 are similar to those of the above embodiments, and therefore, the descriptions thereof are omitted herein.

Figure 6:
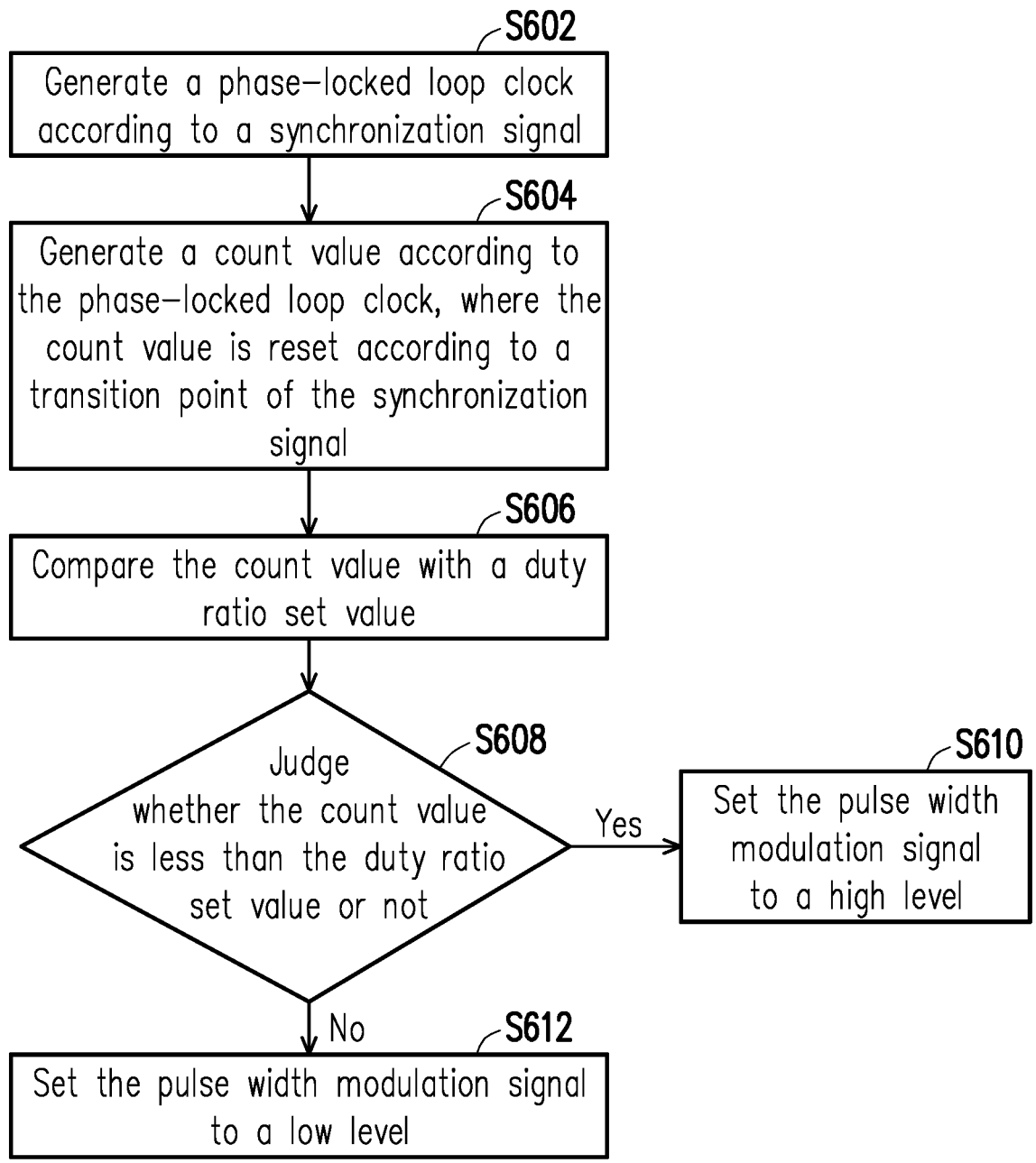
FIG. 6 is a flow diagram of a control method of a pulse width modulation signal according to an embodiment of the embodiment.

FIG. 6 is a flow diagram of a control method of a pulse width modulation signal according to an embodiment of the embodiment, refer to FIG. 6. Known from the above embodiments, a control method of a pulse width modulation signal comprises the following steps: firstly, generating a phase-locked loop clock according to a synchronization signal (step S602); next, generating a count value according to the phase-locked loop clock, where the count value is reset according to a transition point of the synchronization signal (step S604). the mode of resetting the count value may be, for example, to detect a rising edge of the synchronization signal to generate a reset signal and reset the count value according to the reset signal, and in parts of embodiments, the count value may also be reset in a mode of periodically resetting the count value at a transition point (for example the rising edge) of the synchronization signal; then, comparing the count value with a duty ratio set value (step S606) to judge whether the count value is less than the duty ratio set value or not (step S608); if the count value is less than the duty ratio set value, setting the pulse width modulation signal to a high level (step S610); and if the count value is not less than the duty ratio set value, setting the pulse width modulation signal to a low level (step S612), where the duty ratio of the pulse width modulation signal can be regulated by regulating the duty ratio set value.

Based on the above, the counter circuit according to the embodiments of the present invention is capable of generating the count value according to the phase-locked loop clock and resetting the count value according to the transition point of the synchronization signal, so that circuits for resetting the count value can be saved, and furthermore, the circuit area used by the pulse width modulation control circuit can be effectively reduced.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A pulse width modulation control circuit, comprising:
   a phase-locked loop clock generating circuit, generating a phase-locked loop clock according to a display synchronization signal;
   a counter circuit, coupled to the phase-locked loop clock generating circuit and generating a count value according to the phase-locked loop clock, wherein the counter circuit is not coupled to an edge detector, and the counter circuit automatically resets the count value by presetting a reset period of the counter circuit equal to a signal cycle of the display synchronization signal, wherein the reset period of the counter circuit meets a form of $2^N$, and $N=3$; and
   a comparison circuit, coupled to the counter circuit and generating a pulse width modulation signal to control a display period of a display frame by comparing a difference between the count value associated with the display synchronization signal and a duty ratio set value associated with the display period of the display frame,
   wherein the comparison circuit determines whether the count value associated with the display synchronization signal is less than the duty ratio set value associated with the display period of the display frame,
   wherein the comparison circuit sets the pulse width modulation signal to a high level while the count value associated with the display synchronization signal is less than the duty ratio set value associated with the display period of the display frame.

2. The pulse width modulation control circuit according to claim 1, wherein the counter circuit periodically resets the count value according to the transition point of the display synchronization signal.

3. The pulse width modulation control circuit according to claim 1, wherein the display synchronization signal is a vertical synchronization signal.

4. The pulse width modulation control circuit according to claim 1, wherein the count value is reset according to a rising edge of the display synchronization signal.

5. A control method of a pulse width modulation signal, comprising:
   generating a phase-locked loop clock according to a display synchronization signal;
   generating a count value by a counter circuit according to the phase-locked loop clock, wherein the counter circuit is not coupled to an edge detector, and the counter circuit automatically resets the count value by presetting a reset period of the counter circuit equal to a signal cycle of the display synchronization signal, wherein the reset period of the counter circuit meets a form of $2^N$, and $N=3$;
   comparing a difference between the count value associated with the display synchronization signal and a duty ratio set value associated with a display period of the display frame to generate the pulse width modulation signal so as to control a display period of a display frame;
   judging whether the count value associated with the display synchronization signal is less than the duty ratio set value associated with a display period of the display frame or not;
   when the count value associated with the display synchronization signal is less than the duty ratio set value associated with a display period of the display frame, setting the pulse width modulation signal to a high level; and
   when the count value associated with the display synchronization signal is not less than the duty ratio set value associated with a display period of the display frame, setting the pulse width modulation signal to a low level.

6. The control method of the pulse width modulation signal according to claim 5, further comprising:
   periodically resetting the count value according to the transition point of the display synchronization signal.

7. The control method of the pulse width modulation signal according to claim 5, wherein the display synchronization signal is a vertical synchronization signal.

8. The control method of the pulse width modulation signal according to claim 5, wherein the count value is reset according to a rising edge of the display synchronization signal.

* * * * *